United States Patent [19]

Ammann et al.

[11] 4,256,512

[45] Mar. 17, 1981

[54] FLEXIBLE CIRCUIT REFLOW SOLDERING MACHINE

[75] Inventors: Hans H. Ammann, Chester; Michael A. Oien, Chatham Township, Morris County, both of N.J.

[73] Assignee: Bell Telephone Laboratories, Incorporated, Murray Hill, N.J.

[21] Appl. No.: 915,921

[22] Filed: Jun. 15, 1978

Related U.S. Application Data

[62] Division of Ser. No. 812,230, Jul. 1, 1977, Pat. No. 4,115,601.

[51] Int. Cl.³ ............................................. B05C 11/02
[52] U.S. Cl. .................................. 134/64 R; 34/152; 118/33; 118/60; 118/67; 118/600; 118/674; 134/107; 134/114; 134/154
[58] Field of Search ................... 118/33, 61, 600, 674, 118/60, 67, 68, 69, 672; 427/23, 335, 376 G; 134/64 R, 122 R, 105, 107, 109, 154, 182, 114; 226/92; 34/23, 152

[56] References Cited

U.S. PATENT DOCUMENTS

| | | | |
|---|---|---|---|
| 2,944,345 | 7/1960 | Faeber | 226/92 X |
| 3,067,056 | 12/1962 | Remer | 118/600 |
| 3,142,588 | 7/1964 | Phillips | 226/92 X |
| 3,250,244 | 5/1966 | Reinhart | 118/674 |
| 3,280,294 | 10/1966 | Polizzano | 118/61 X |
| 3,346,413 | 10/1967 | Lindemann | 427/96 |
| 3,704,165 | 11/1972 | McLain et al. | 427/96 |
| 3,707,762 | 1/1973 | Bochinski et al. | 427/96 |
| 3,737,499 | 6/1973 | Kamena | 264/134 |
| 3,866,307 | 2/1975 | Pfahl, Jr. et al. | 29/498 |
| 3,904,102 | 9/1975 | Chu et al. | 228/180 |

OTHER PUBLICATIONS

Dingman, "Solvent Vapor Solder Reflow", IBM Technical Disclosure Bulletin, vol. 13, No. 3, p. 639, Aug., 1970.

*Primary Examiner*—John P. McIntosh
*Attorney, Agent, or Firm*—John W. Fisher

[57] ABSTRACT

A process and machine are disclosed for reflowing solder plated continuous flexible circuit webs. During reflow in a vapor environment, the flexible web is maintained in a planar orientation to produce a relatively uniform distribution of solder. Virtually all of the heat transfer fluid used in producing the vapor is recovered and retained.

18 Claims, 12 Drawing Figures

- COLD SURFACE
- LIQUID
- VAPOR ZONE

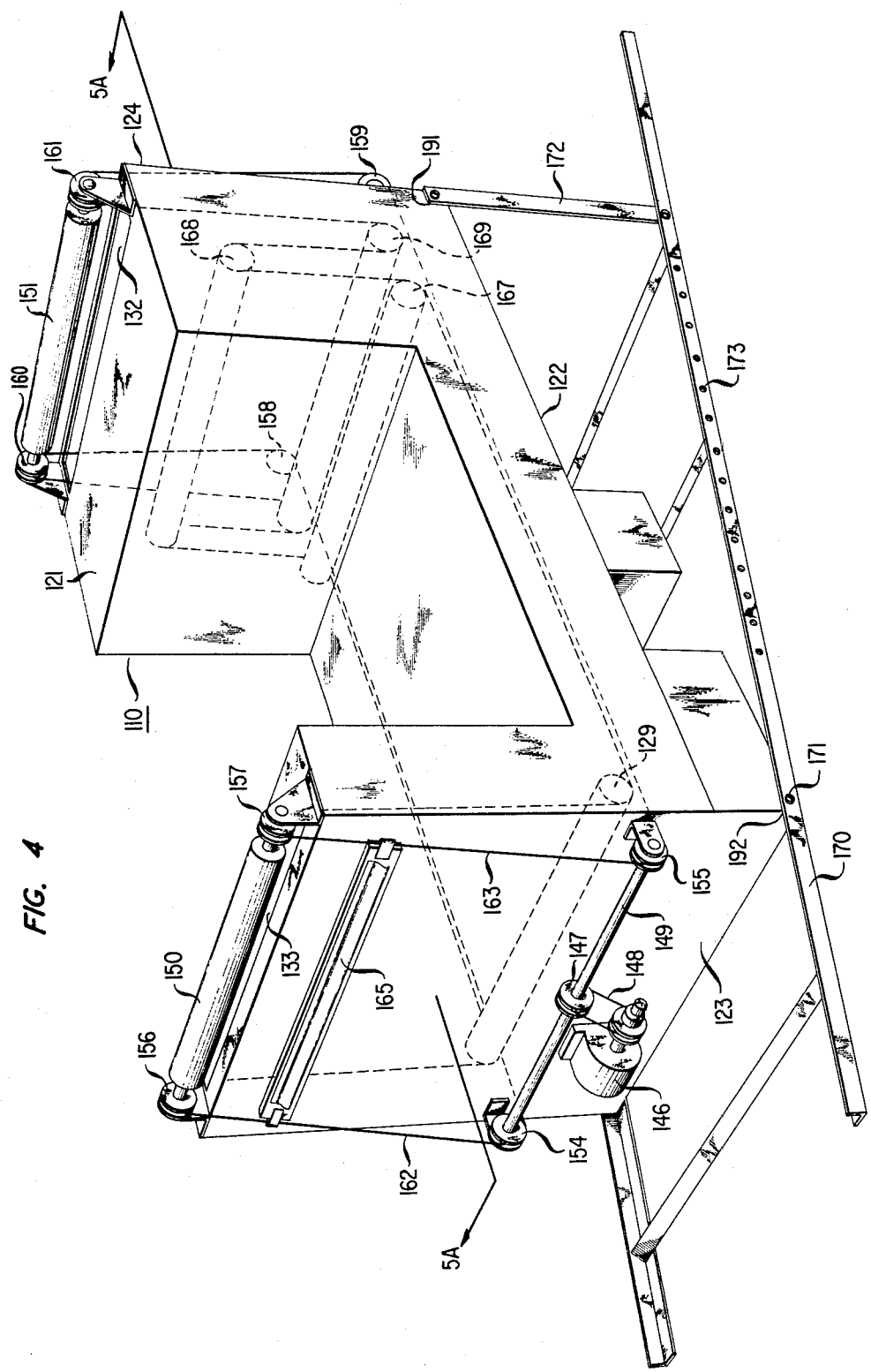

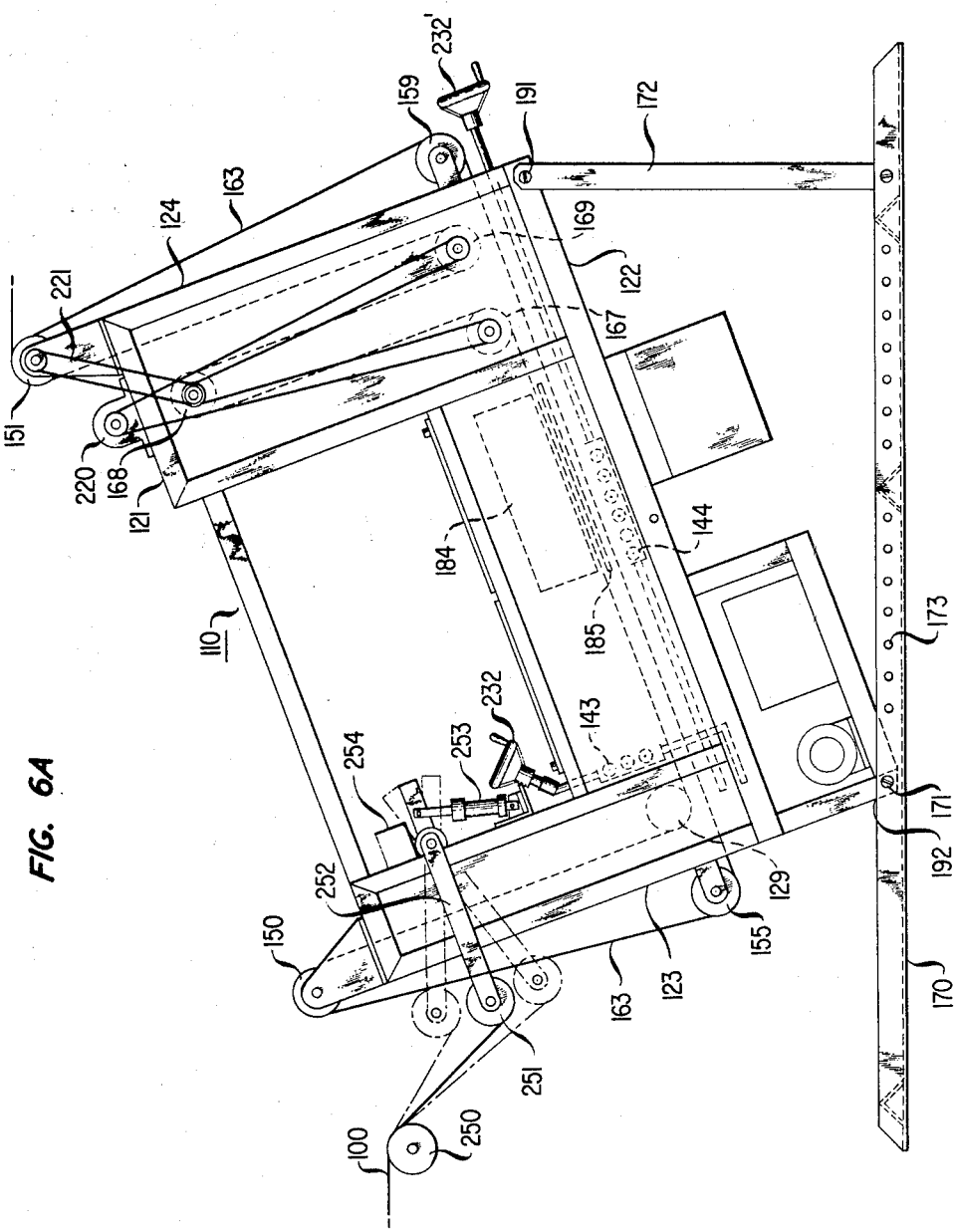

FLEXIBLE CIRCUIT REFLOW SOLDERING MACHINE

CROSS REFERENCE TO RELATED APPLICATION

This is a division of application Ser. No. 812,230, filed July 1, 1977, now U.S. Pat. No. 4,115,601.

BACKGROUND OF THE INVENTION

1. Field of the Invention

This invention relates to a process and machine for effecting solder reflow operations and, in particular, to a process and machine for reflowing solder plated continuous flexible circuit webs with negligible loss of heat transfer fluid.

2. Description of the Prior Art

Several methods have been disclosed in the prior art for effecting solder reflow operations on printed circuits through the use of hot saturated vapors. One such method is briefly described in an article entitled "Solvent Vapor Solder Reflow" by E. G. Dingman, appearing in the *IBM Technical Disclosure Bulletin*, Vol. 13, No. 3, August 1970, at page 639. Dingman discloses use of boiling solvents to rapidly and selectively apply heat to small areas having high thermal conductivity to enable solder rework operations with materials and components that are heat sensitive. It seems readily apparent that Dingman does not address the problems of handling large and continuous flexible circuit webs or loss of the boiling solvent.

One method for continuously handling printed circuits is disclosed in R. C. Pfahl, Jr. et al U.S. Pat. No. 3,866,307, issued Feb. 18, 1975. In this method individual circuit boards are loaded onto a conveyor and passed through a receptacle containing hot saturated vapors of an expensive fluid and a wave soldering font. Individual circuit boards are heated by the vapors and skim the solder wave at a low point of the conveyor catenary. One problem resulting from the Pfahl, Jr. et al approach is that solder tends to pool at the low point of the catenary. Another problem is that despite attempts to retain the expensive fluid, substantial quantities are dragged out of the receptacle along with the conveyor and the circuit boards themselves.

Another method disclosed in T. Y. Chu et al U.S. Pat. No. 3,904,102, issued Sept. 9, 1975, attempts to reduce loss of the expensive fluid by use of a less expensive vapor blanket atop the primary vapor zone. One embodiment of the Chu et al method utilizes batch processing techniques. A group of printed circuits is lowered into a receptacle containing the primary vapor zone and the secondary vapor blanket. In another embodiment a conveyor carries the individual circuits into the vapor zone. However, in both embodiments significant quantities of the expensive primary fluid are still lost. Moreover, the second embodiment continues to suffer from solder pooling effects. The first embodiment obviously is not readily adaptable for handling continuous webs of printed circuits.

A somewhat related application of the use of hot vapors is disclosed in K. W. Kamena U.S. Pat. No. 3,737,499, issued June 5, 1973. The Kamena method is used for modifying plastic surfaces on articles of manufacture. An individual plastic article is inserted into a multicompartmented chamber containing one or more vapor regions. The heated vapors impinge on the surfaces of the plastic articles and dissolve at least a molecular layer to remove any surface blemishes and produce a smooth, continuous finish. Kamena, like Pfahl, Jr. et al and Chu et al, also suffers loss of the vapor material through web dragout.

Accordingly, it is one object of the present invention to implement solder reflow operations on a continuous, flexible circuit web without solder pooling.

Another object is to virtually eliminate any distortion of the web dimensions during solder reflow operations.

Still another object of the present invention is to substantially reduce the possibility of dielectric deterioration caused by the solder reflow process.

Yet another object is to virtually eliminate solder slivers produced during etching operations.

A further object of the present invention is to reveal any discontinuities in the printed circuit which may have been bridged by solder during the solder plating process.

Still a further object of the present invention is to indicate the solderability of the flexible circuits.

Yet another object is to facilitate visual inspection of the flexible circuits.

Still a further object is to improve the appearance of the flexible circuits.

An even further object is to significantly reduce, if not virtually eliminate, any loss of the expensive working fluid resulting from web dragout, diffusion and convection.

SUMMARY OF THE INVENTION

The foregoing and other objects of the invention are realized in an illustrative embodiment of a process and machine for processing a reflowable solder-plated flexible circuit web wherein the flexible circuit web is introduced into a first chamber having a vapor diffusion trap at an entry port and a liquid seal at an exit port. The temperature of the flexible circuit web is controlled in the first chamber to a point below the solder eutectic temperature. Moreover, provision is included in the first chamber for positioning the flexible circuit web in a planar orientation for entry into a second chamber, containing a condensing vapor, at a point below the vapor-air interface. This condensing vapor is confined in the second chamber by the liquid seal. Upon entry into the second chamber the flexible circuit web is exposed to the condensing vapor for a time sufficient to melt and reflow the solder while maintaining on the flexible circuit web a condensate film to aid in subsequently evaporatively cooling the flexible circuit web below the solder eutectic temperature. Residual traces of condensate on the flexible circuit web are recaptured and thereafter the flexible circuit web is removed through an exit port.

Accordingly, it is one feature of the present invention that the flexible circuit web undergoes a preheating operation during passage through the liquid seal.

Another feature is that the liquid seal confines vapors of the expensive working fluid internal to the machine and keeps the solder below the eutectic temperature prior to entry into the condensing vapors.

Yet another feature of the present invention is that the flexible circuit web is positioned at low web tension in a planar orientation during passage through the vapor zone thereby virtually eliminating solder pooling on the web.

Another feature is that oxidizing environments are avoided during solder reflow operations.

Yet another feature of the present invention is that flux application and its subsequent removal are avoided.

A further feature is that a sufficient vapor condensate film is retained on the flexible circuit web after exiting from the vapor zone to materially aid in evaporatively cooling the reflowed solder below its eutectic temperature before mechanically contacting surfaces which might redistribute the reflowed solder.

Still a further feature of the present invention is that the liquid seal at the entry side of the vapor chamber and a plurality of reheat rollers and diffusion traps at the exit side of the vapor chamber prevent any significant loss of the expensive working fluid through web dragout.

An even further feature is that the plurality of reheat rollers and diffusion traps facilitate recapture and reuse of any residual traces of condensate on the continuous, flexible circuit web.

Yet a further feature of the present invetion is that the machine can be advantageously elevated on its output side between an angle of 10 to 30 degrees to achieve a range of planar orientations of the web with respect to horizontal, to facilitate return of the recaptured working fluid to its reservoir, and to control the amount of solder slump. Specifically, the machine parameters, including slope, may be adjusted advantageously to process a wide variety of flexible circuits over a wide range of throughput speeds.

BRIEF DESCRIPTION OF THE DRAWINGS

The aforementioned objects and features of the invention, as well as other objects and features, will be better understood upon consideration of the following detailed description and appended claims, taken in conjunction with the attached drawings of an illustrative embodiment in which:

FIG. 4 is a simplified perspective view of a solder reflow machine used in practicing the process, in particular, illustrating the slope adjustability feature and the threading aid feature;

FIG. 6A illustrates the main condenser adjustability, slope adjustment, and web tension control and drive system features;

DETAILED DESCRIPTION

Figure 1:
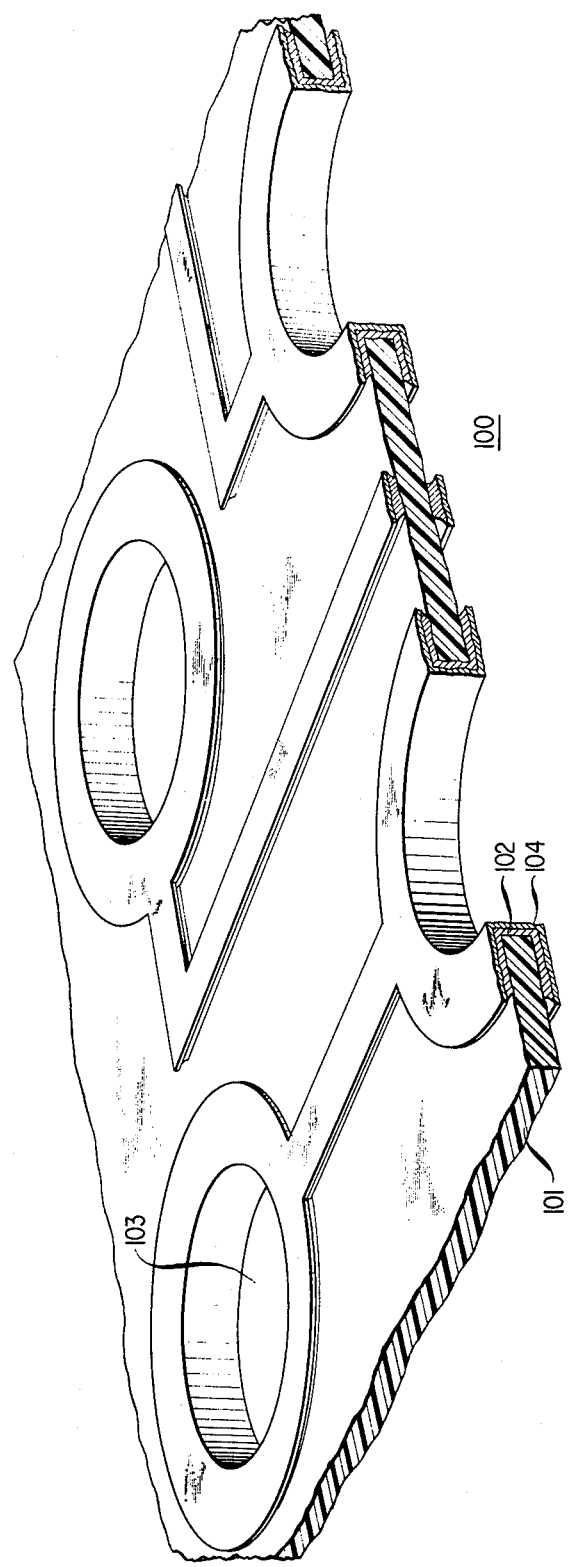
FIG. 1 illustrates a flexible circuit web having a number of electrically conductive patterns thereon and plated-through holes therethrough.

A flexible circuit web 100, as shown in FIG. 1, is comprised of a dielectric substrate 101 onto which is bonded a patterned conductive foil 102. The patterned conductive foil 102 is utilized to effect electrical circuit connections among a plurality of electric circuit components (not shown). Conductive foil 102 can be advantageously bonded on one or both sides of flexible circuit web 100. On double-sided circuits, the patterns of conductive foil 102 are generally interconnected, for example, by one or more plated-through holes 103.

In manufacturing flexible printed circuits, a solder coating 104 is placed atop conductive foil 102 for several reasons. First, in numerous applications, solder coating 104 is used as an etch resist. In the etch resist application of solder coating 104, oftentimes underetching occurs near the edges of conductive foil 102. This leaves a solder lip projecting outwardly from conductive foil 102. Such lips are susceptible to fracture and the formation of slivers during handling or subsequent processing. These slivers of solder can cause shorts between electrical circuits, thereby causing circuit failure. Second, solder coating 104 inhibits oxidation and corrosion of conductive foil 102 to reduce the possibility of circuit failure through these mechanisms. Third, solder coating 104 enhances solder wetting of the circuit during subsequent solder assembly operations.

Implementation of reflow soldering, by virtue of the surface tension characteristics of solder, causes these solder lips, when molten, to draw up onto conductive foil 102. A further advantage of reflow soldering is that on double-sided circuits, solder sometimes bridges gaps in conductive foil 102. These solder bridges may disguise defects in the circuit which might lead to subsequent failure. Solder reflow eliminates these bridges and exposes possible circuit defects.

Solder reflow also provides a means for perceiving solder wetability, and consequently provides a measure of acceptability for further processing. An additional advantage of solder reflow is that it aids in improving the cosmetic appearance of the circuit, thereby enhancing customer acceptability.

Figure 2A:
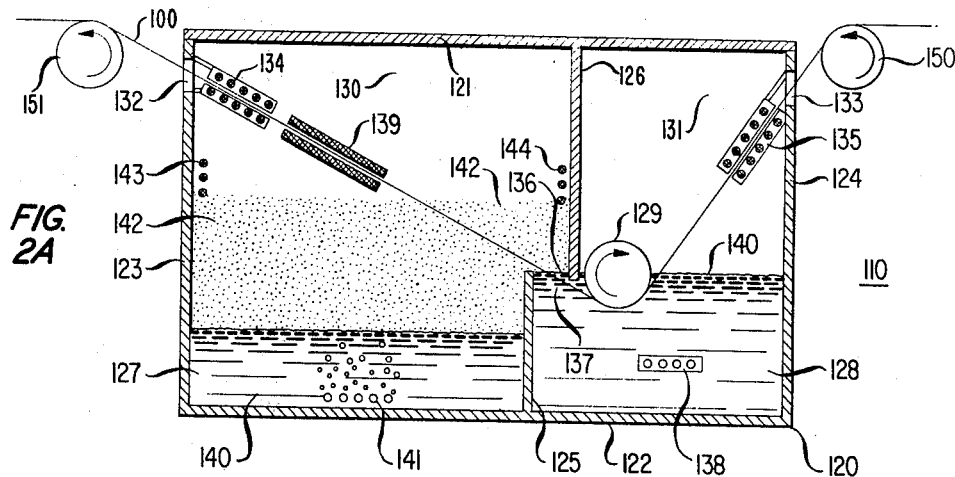
FIG. 2A is a simplified embodiment illustrating the solder reflow process.
Figure 2B:
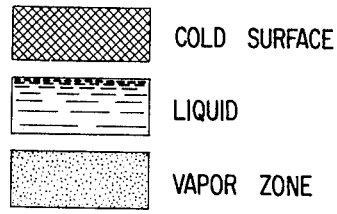
FIG. 2B defines the shading code used in FIG. 2A and all similarly shaded FIGS.

Illustrated in FIG. 2A is a simplified embodiment of a solder reflow machine 110. This simplified version facilitates an understanding of the details of the solder reflow process. The solder reflow machine 110 is comprised of an enclosure 120 having a top 121, a bottom 122, and a pair of sidewalls 123 and 124. The remaining two sidewalls are not shown in order to facilitate this description. A baffle 125 extends upwardly from an intermediate point of bottom 122 to a point spaced apart from top 121. Another baffle 126 extends downwardly from an intermediate point of top 121 to a point spaced apart from bottom 122. Baffles 125 and 126 separate enclosure 120 into four definable compartments. These compartments are hereinafter referred to, in the course of this conceptual description, as first and second sumps, 127 and 128, and first and second chambers, 130 and 131. Chamber 130 spans sump 127 and a portion of sump 128. Chamber 131 spans the remainder of sump 128. Each of chambers 130 and 131 has a port 132 and 133, respectively, associated therewith near top 121. Set apart from bottom 122 in sump 128 is positioning roller 129.

A single noncorrosive working fluid 140 having a boiling point at atmospheric pressure sufficiently in excess of the liquidus temperature of the solder to be reflowed is contained in sumps 127 and 128 which, as noted previously, are separated from one another by baffle 125. Baffle 125 is of sufficient height to keep the working fluid 140 contained in sumps 127 and 128 generally separated. However, baffle 125 is not so high that a portion of working fluid 140 in sump 128 cannot spill over into sump 127. Heating elements 141 located in sump 127 boil working fluid 140 to produce a vapor more dense than air. The resulting vapor forms a vapor zone 142 which partially fills chamber 130. The height of vapor zone 142 is controlled in chamber 130 by a plurality of condenser elements 143 and 144 along sidewall 123 and baffle 126, respectively.

As illustrated in FIG. 2A, flexible circuit web 100 passes over feed roller 150, enters port 133 in chamber 131, passes into working fluid 140, and is routed about roller 129. The temperature of working fluid 140 in sump 128 is maintained below the solder eutectic temperature of solder coating 104 on web 100 by temperature control element 138. However, the temperature is high enough to perform some preheating of web 100.

After passage around roller 129, web 100 with solder coating 104 thereon passes into vapor zone 142. The heated vapors in vapor zone 142 condense onto the relatively cool web, thereby effectively heating web 100 to a temperature above the solder liquidus temperature, melting solder coating 104 and causing it to reflow. During reflow, web 100 is moved in a planar orientation at a selectable angle with respect to a horizontal plane. This orientation ensures that solder coating 104, after reflow, is maintained at a generally uniform thickness while in its molten state.

Following passage through vapor zone 142, flexible circuit web 100 passes through cooling element 139, diffusion trap 134, and out through port 132 in first chamber 130 where it passes over a cooled discharge roller 151 to a take-up reel (not shown). The cooling of discharge roller 151 is accomplished in a well-known manner and, hence, the details of such cooling are not specifically illustrated. To prevent solder smearing, some form of cooling is desirable prior to web 100 being brought into contact with discharge roller 151. In this embodiment, after passage through vapor zone 142 sufficient quantities of vapor condensate are retained on web 100 such that during the remainder of the time web 100 is contained within chamber 130 the condensate film evaporatively cools the reflowed solder below its eutectic temperature.

Escape of any vapors of working fluid 140 through ports 132 and 133 is essentially prevented by vapor diffusion traps 134 and 135 positioned near ports 132 and 133, respectively. Diffusion traps 134 and 135 are shown as simplified structures in FIGS. 2A and 3 so as not to overcomplicate the description at this point. A more specific structure of diffusion traps 134 and 135 will be described in reference to FIG. 5A.

Figure 3:
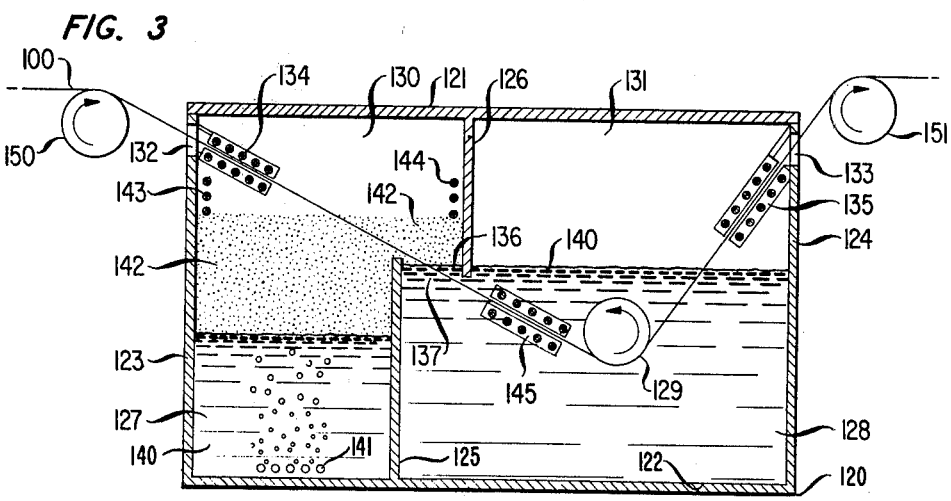
FIG. 3 is an alternate simplified embodiment illustrating the solder reflow process.

In the alternate embodiment shown in FIG. 3, flexible circuit web 100 is fed over roller 150 through port 132 in sidewall 123 and through diffusion trap 134 into chamber 130. Upon entry of web 100 into chamber 130, it is exposed to vapor zone 142. The hot vapors melt solder coating 104 on web 100, causing the solder to reflow. Following passage through vapor zone 142, web 100 passes through liquid seal 137 at exit port 136 separating chamber 130 from sump 128. Once in sump 128, web 100 is further cooled by passage through cooling elements 145.

To insure that web 100 is maintained in a planar orientation during its passage through vapor zone 142, positioning roller 129 in sump 128 is used in conjunction with roller 150 to control the orientation of web 100 during this phase of the process. It should be noted that in the embodiment illustrated in FIG. 2A similar positioning effects are achieved with comparable roller 151.

Additional cooling is provided following passage of web 100 around roller 129, so that upon emerging from sump 128, solder coating 104 on web 100 is well below its euctectic temperature. At this point, web 100 is withdrawn from chamber 131 through diffusion trap 135 and out through port 133 where it passes over roller 151 and is taken up by a take-up reel (not shown).

Regardless of which embodiment is used, these embodiments being shown in FIGS. 2A and 3, one significant feature is that during passage of web 100 through vapor zone 142, web 100 is maintained in a planar orientation. This orientation insures a relatively uniform thickness of the layer of solder coating 104 on web 100 following the reflow process. Another feature is that the use of liquid seal 137 between sumps 127 and 128 significantly aids in preventing the loss of vapors of working fluid 140. Diffusion traps 134 and 135 at entry and exit ports 132 and 133 further aid in reducing the amount of loss of working fluid 140.

The preferred embodiment for machine 110 used in implementing the solder reflow process is shown in FIG. 4 in outline form. Specifically illustrated is apparatus on machine 110 for aiding in the threading of flexible circuit web 100 through the various chambers in the machine. Also specifically shown is apparatus which facilitates elevation of one end of machine 110 with respect to an opposite end thereof which apparatus controls the angle between a plane containing web 100 and a horizontal plane.

To aid in threading flexible circuit web 100 through the various chambers in machine 110, there are affixed to sidewall 123 a pair of pulleys 154 and 155. Idler pulleys 156 and 157 at the end of roller 150 and pulleys 160 and 161 at the end of roller 151, are affixed to top 121. Additional idler pulleys 158 and 159 are affixed to sidewall 124. Similar idler pulleys (not shown) are affixed to the ends of rollers 129, 167, 168, and 169 internal to machine 110.

Looped around pulleys 154, 156, 158, and 160 is a continuous, flexible transport member 162, and looped around pulleys 155, 157, 159, and 161 is a similar transport member 163. Transport members 162 and 163 may be advantageously, for example, continuous cables, chains or the like.

In order to drive transport members 162 and 163 there is coupled to pulleys 154 and 155 a shaft 149 which has affixed thereon, at an intermediate point along its length, a drive pulley 147. Motor 146, mounted on sidewall 123, is coupled to drive pulley 147 by drive belt 148. When motor 146 is actuated, shaft 149 rotates, and this rotation forces transport members 162 and 163 to threadably traverse the various chambers in machine 110.

Coupled to transport members 162 and 163 is bar 165. Bar 165, when fastened to transport members 162 and 163, enables flexible circuit web 100 to be looped therearound and fastened onto itself. Upon actuation of motor 146, web 100 is carried via transport members 162 and 163 and bar 165 through machine 110. Once flexible circuit web 100 is threadably inserted through the various chambers in machine 110, motor 146 is stopped and bar 165 can be removed from transport members 162 and 163. Thereafter, flexible circuit web 100 can be brought into engagement with a take-up reel (not shown). Once web 100 is threadably inserted into machine 110, the solder reflow process becomes continuous merely by fastening one flexible circuit web 100 to another by means such as stapling the two webs together.

To facilitate elevation of one end of machine 110, for a purpose to become apparent subsequently, machine 110 has bottom edge 192 affixed to frame 170 by pivot 171. Elevation strut 172, pivotally mounted to opposite bottom edge 191 of machine 110, permits raising edge 191 relative to edge 192. Adjustment of the slope between an angle of 10 to 30 degrees is readily implemented by changing the attachment position of strut 172 to frame 170 along a plurality of apertures 173. Once the appropriate elevation is selected, strut 172 is held juxtaposed the appropriate aperture 173 by a holding pin (not shown).

Figure 5A:
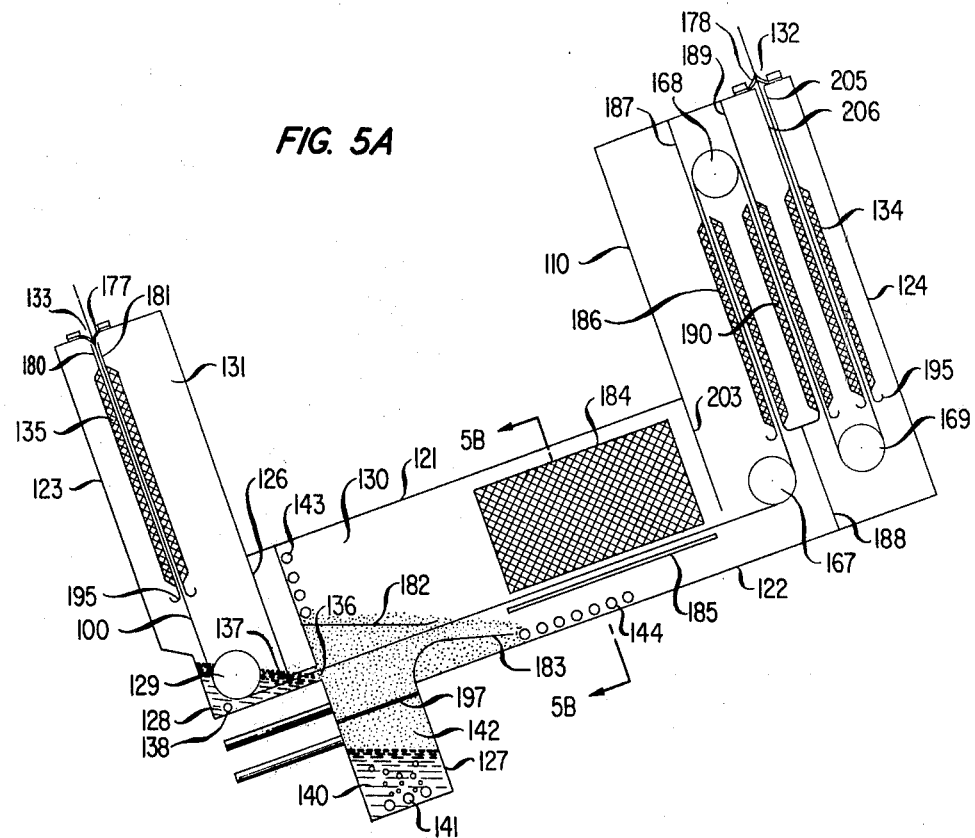
FIG. 5A is a sectional view along line 5A—5A of FIG. 4 illustrating the various chambers and rollers utilized in the solder reflow machine to practice the process.

The preferred embodiment of machine 110 is shown in cross sectional view in FIG. 5A. Flexible circuit web 100 enters machine 110 by downwardly deflecting wiper assembly 177 at entry port 133. Wiper assembly 177, similar to that shown in FIG. 7, along with baffles 180 and 181 and the close spacing along diffusion trap 135, virtually prevent escape of any working fluid 140 from machine 110 at the point of entry of flexible circuit web 100. Following passage through diffusion trap 135, web 100 is immersed into fluid 140 in sump 128 and is passed around roller 129. Roller 129 positions web 100 for entry into chamber 130 so that web 100 will encounter vapor zone 142 in a planar orientation below the vapor air interface. Moreover, temperature control element 138 controls the temperature of fluid 140 so that it preheats solder coating 104 on web 100 to just below the solder eutectic temperature. In the event the temperature of fluid 140 is sufficiently high so as to generate any vapors, these vapors, upon exposure to diffusion trap 135, are condensed into liquid form. Consequently, troughs 195 are provided at lower ends of diffusion trap 135 so that any recondensed vapors are returned to sump 128 rather than forming on web 100.

After passing around roller 129, web 100 is routed through passageway 136 separating sump 128 from vapor zone 142. Passageway 136 is formed by baffle 126 which extends from top 121 downwardly to a point spaced apart from bottom 122. To preclude escape of vapors from chamber 130, the fluid in sump 128 is maintained at a level just above passageway 136. Hence, web 100 enters chamber 130 through liquid seal 137.

Vapor zone 142 in chamber 130 is generated by boiling fluid 140 in sump 127 by heating elements 141. The temperature of heating elements 141 is controlled in order to maintain fluid 140 in contact with them at a nearly uniform temperature. This is effected by making heating elements 141 such that they have a uniform resistance per unit of length. This uniform resistance ensures that a proportionate reduction in power will produce a proportionate reduction in heat flux. The reduction in heat flux results in fewer hot spots being formed in fluid 140 and this, in turn, improves the usable lifetime of fluid 140.

Figure 6B:
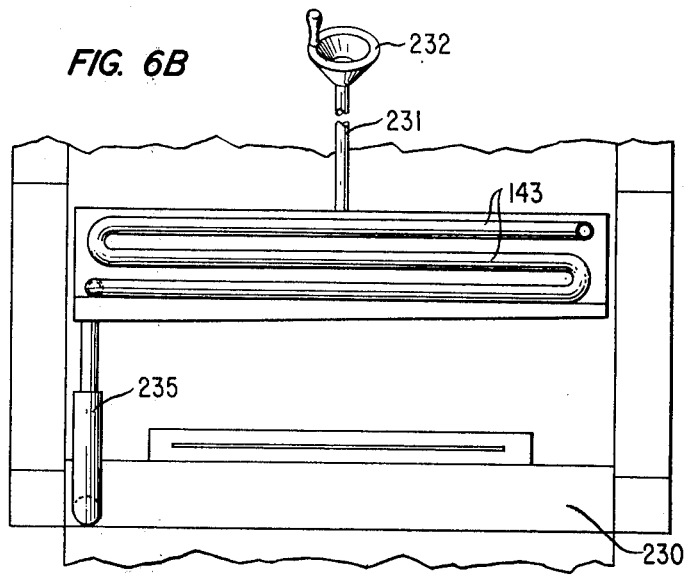
FIGS. 6B and 6C are partial cutaway views further showing condenser adjustability.
Figure 6C:
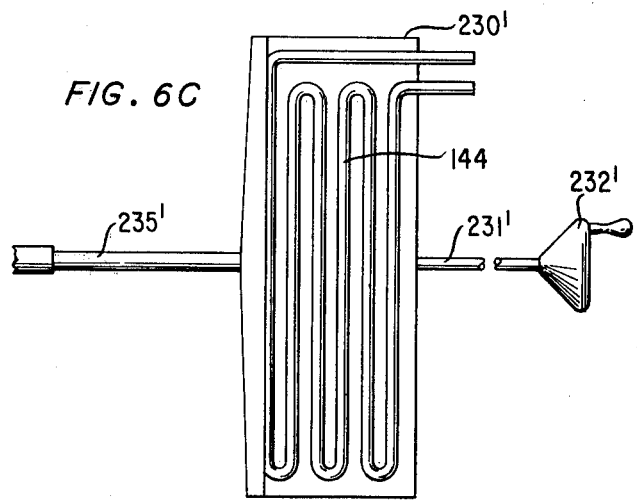

Control of the height of the vapor air interface is effected by condenser elements 143 and 144 positioned along enclosing surfaces of chamber 130 containing vapor zone 142. The location of condenser elements 143 and 144, which elements are adjustable as shown most clearly in FIGS. 6B and 6C, along with the elevation angle of bottom edge 191 of machine 110 and the speed of travel of web 100 fixes the time of exposure of solder coating 104 on web 100 to vapor zone 142.

Baffles 182 and 183 are positioned just below the vapor air interface to decrease the amount of convection air interacting with solder coating 104 during its passage through vapor zone 142. This results in a more uniform exposure of web 100 to the hot vapors of vapor zone 142 and this in turn results in an improved cosmetic appearance of flexible circuit web 100 because the presence of air in the vicinity of the reflowed solder tends to oxidize the solder thereby dulling the finish. In order to prevent any droplets of fluid 140 from entering vapor zone 142, a demister unit 197 is provided in sump 127.

During the passage of flexible circuit web 100 through vapor zone 142, the hot vapors heat solder coating 104 above its liquidus temperature causing the solder to reflow. Since web 100 is maintained in a planar orientation during this passage the effects of solder slumping are reduced and solder coating 104 is provided with a more uniform distribution. Moreover, by controlling the transit time and planar angle of web 100 as it passes through vapor zone 142, sufficient condensate is allowed to form on web 100.

The formation of this condensate materially aids in the cooling of web 100 as it passes between upper condenser element 184 and lower condenser element 185. Cooling at this point is desirable in order to bring the temperature of solder coating 104 below its eutectic temperature prior to its being brought into contact with roller 167.

Figure 5B:
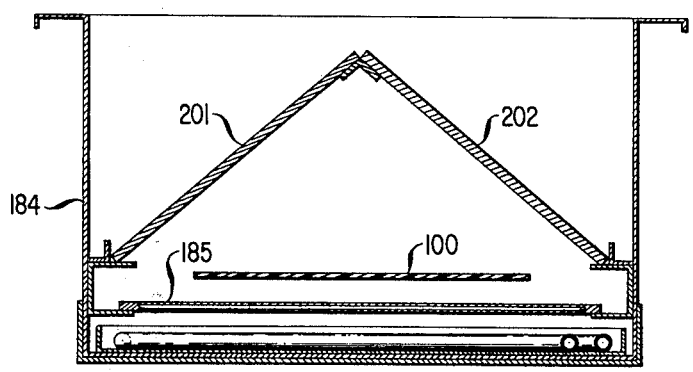
FIG. 5B is a sectional view along line 5B—5B of FIG. 5A illustrating the doghouse-like cooling arrangement.

Upper condenser element 184, as shown in FIG. 5B, has a doghouse-like shape so that any condensate driven off web 100 onto this condenser is prevented from dripping back onto web 100. To achieve this effect upper condenser element 184 includes oppositely directed members 201 and 202, as shown in FIG. 5B, which members are oriented at a common angle with respect to a plane containing flexible circuit web 100.

As a first step in prohibiting escape of vapors of working fluid 140, baffle 203 separates chamber 130 from the follow-on stages used to recapture any residual traces of fluid 140 which may have a tendency to escape through web dragout. Following cooling by virtue of doghouse-shaped condenser elements 184 and 185, web 100 engages a plurality of reheat rollers 167 through 169 and a corresponding plurality of diffusion traps 186, 190, and 134, respectively. Roller 167 and diffusion trap 186 are separated from roller 168 and diffusion trap 190 by baffles 187 and 188. Similarly, roller 168 and diffusion trap 190 are separated from roller 169 and diffusion trap 134 by baffles 188 and 189.

Upon engagement of web 100 with each of rollers 167 through 169, it is reheated to a temperature just below the eutectic temperature of solder coating 104. This reheating vaporizes any residual traces of condensate of fluid 140 so that upon entering diffusion traps 186, 190, and 134, this condensate is removed from web 100. The presence of baffles 187 through 189 ensures that with each successive stage lesser amounts of condensate are available for removal from machine 110 by web dragout.

To facilitate return of the recaptured condensate to sump 127 each of diffusion traps 186, 190 and 134 are provided with troughs 195 at their lower extremities. Troughs 195 reduce the possibility of recaptured condensate coming into contact with web 100.

Figure 7:
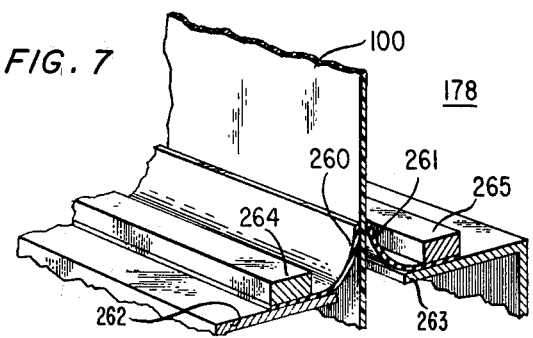
FIG. 7 is a partial cutaway view illustrating wiper arrangements used at both the entry and exit ports of the machine to further aid in recapture of the working fluid.

Following passage of web 100 around reheat roller 169 and through diffusion trap 134, it emerges through exit port 132. To further inhibit escape of any vapor of fluid 140, diffusion trap 134 is coupled to exit port 132 by baffles 205 and 206 which are spaced closely together. In addition, exit port 132 is equipped with a wiper assembly 178, as shown in FIG. 7, which further provides for removal of any traces of vapor of fluid 140 carried by web 100.

It should be noted that during passage of web 100 through vapor zone 142, web 100 is maintained in a planar orientation even at low web tensions. This effect is achieved with rollers 129, 167, 168, and 169 along with input roller 150 and discharge roller 151. The manner in which this effect is achieved will become clear upon consideration of FIG. 6A. Moreover, as noted above, condenser elements 143 and 144 are adjustable so that along with the speed of travel of web 100 and the angle of elevation of bottom edge 191 with respect to bottom edge 192 of machine 110, the exposure time of solder coating 104 to vapor zone 142 can be accurately controlled. The manner of adjustment of condenser elements 143 and 144 will be considered subsequently.

Illustrated in FIG. 6A is apparatus for transporting flexible circuit web 100 through machine 110 such that web 100 is maintained in a planar orientation at low web tension during its passage through vapor zone 142. In particular, motor 220 mounted on top 121, shown only in FIG. 6A for clarity, drives discharge roller 151 and intermediate rollers 167 through 169 by drive chains 221. To control the tension in web 100 as it is fed from supply roller 250, variably adjustable tension roller 251 is used. Tension roller 251 is coupled to pneumatic constant load device 253 by tension control arm 252. Coupled to tension control arm 252 is tension arm position sensor 254.

If the feed rate of web 100 into machine 110 slows down relative to the machine output speed, the amount of web 100 looped around tension roller 251 decreases and tension control arm 252 swings in an upward direction. Simultaneously, tension arm position sensor 254 detects this change in position of tension control arm 252 and as a result an electrical signal is produced which causes drive motor 220 to slow down. The decrease in rotational speed of drive motor 220 arrests the imbalance between the feed rate and machine output speed, thereby effectively controlling the amount of web looped around tension roller 251 so that the tension in web 100 is held nearly constant during its passage through machine 110.

To further insure that web 100 passes through vapor zone 142 in a planar orientation, bottom edge 191 of machine 110 is adjustable with respect to bottom edge 192. This elevation adjustability aids in providing a more uniform thickness to solder coating 104 following the solder reflow process without the detrimental effects caused by solder slump inherent in catenary feed arrangements. This elevation adjustability further aids in controlling the amount of vapor condensate remaining on web 100 as it rises above the vapor air interface for evaporative cooling.

Control of the height of vapor zone 142 is achieved by the adjustability of condenser elements 143 and 144. Each of condenser elements 143 and 144, as shown most clearly in FIGS. 6B and 6C, respectively, includes movable pans 230 and 230' for housing the condenser elements themselves. Pans 230 and 230' can be moved advantageously in either a generally vertical or generally horizontal direction, as appropriate. To effect this movement pans 230 and 230' are coupled via shafts 231 and 231' to hand cranks 232 and 232', respectively.

Since condenser elements 143 and 144 provide direct cooling, it is desirable that any condensate forming thereon be returned directly to sump 127 without coming into contact with flexible circuit web 100. To achieve this end pans 230 and 230' are provided with telescoping tubes 235 and 235' which couple pans 230 and 230' directly to sump 127 regardless of the position of condenser elements 143 and 144 with respect to sump 127. This arrangement has the further effect of minimizing the production of excessively hot vapors needed to maintain vapor zone 142 and this, in turn, increases the useful lifetime of working fluid 140.

Additional measures used to prevent the loss of fluid 140 are represented by the wiper arrangement shown in FIG. 7 and briefly discussed earlier. Specifically illustrated in cross sectional form is the wiper arrangement at exit port 132. Flexible membranes 260 and 261 are affixed in overlapping alignment along edges 262 and 263, respectively, of exit port 132 by rigid members 264 and 265. As web 100 emerges from exit port 132, membranes 260 and 261 are flexed outwardly forming a seal about web 100. This seal prevents any convective loss of vapor due to web 100 dragging out the mixture of air and vapor existing near diffusion trap 134.

Figure 8:
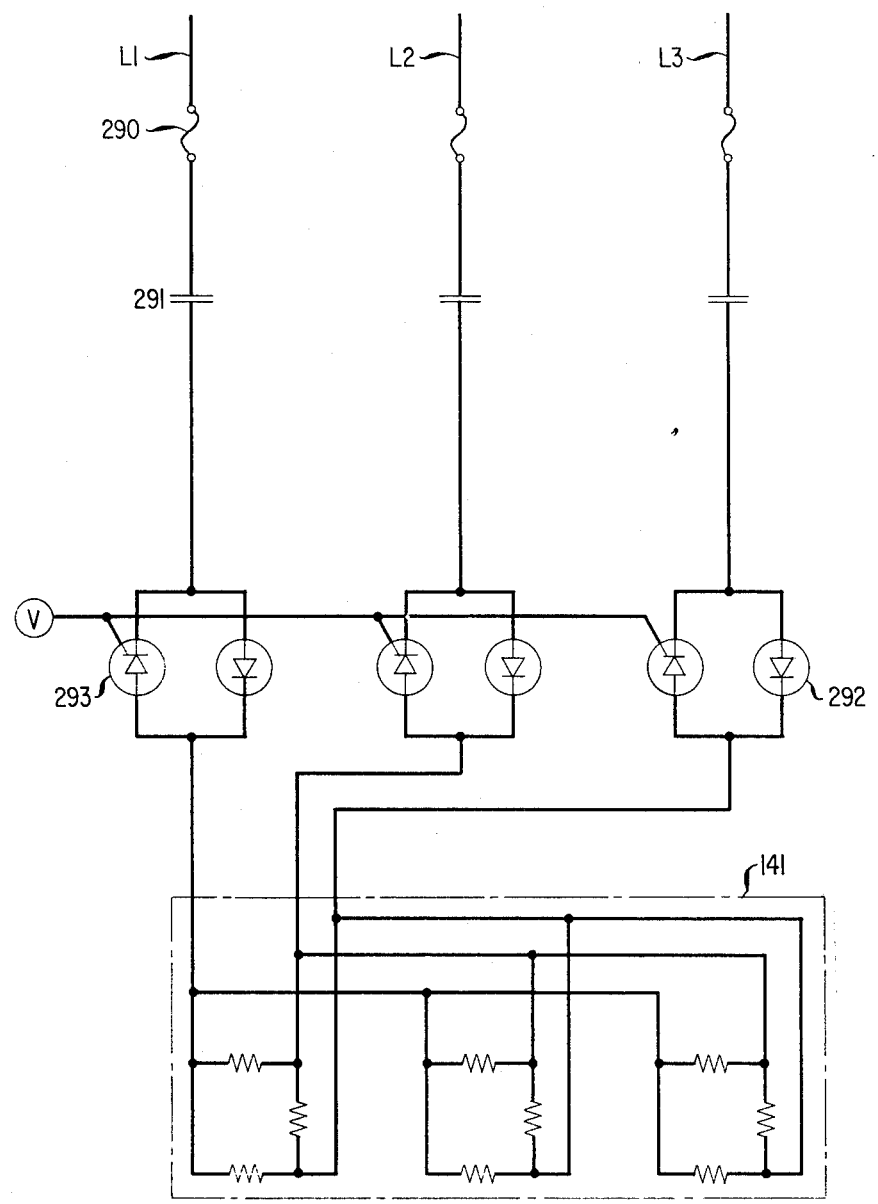
FIG. 8 is a silicon-controlled rectifier circuit for maintaining uniform heating temperatures and for minimizing the temperature of the heating elements to thereby increase the lifetime of the working fluid.

As noted previously, heating elements 141 are used to control the boiling rate of fluid 140 and to avoid the production of hot spots thereby increasing the lifetime of fluid 140. Besides making heating elements 141 such that they have a uniform resistance per unit of length, the power to them is controlled so that a proportionate reduction in power produces a proportionate reduction in heat flux. This result is achieved by the silicon controlled rectifier circuit illustrated in FIG. 8.

Three phase, 60 cycle AC commercial power is coupled through fuses 290 to filter capacitors 291. Following each capacitor 291 there is a parallel circuit comprised of diode 292 and a silicon controlled rectifier 293. Diode 292 provides rectification of the AC power and silicon controlled rectifier 293, by virtue of a trigger bias voltage coupled thereto, fairly accurately controls the amount of rectified power supplied to heating elements 141. This arrangement insures that all heating elements 141 are activated uniformly which, in turn, virtually eliminates hot spots in fluid 140 thereby increasing its useful lifetime.

In all cases it is to be understood that the above-described embodiments are but representative of many possible specific embodiments which can be devised readily in accordance with the principles of the disclosed invention. Thus, numerous and various other embodiments can be effected readily by those skilled in the art without departing from the spirit and scope of the invention.

What is claimed is:

1. A machine for processing reflowable solder plated flexible circuit webs comprising:
an enclosure containing first and second sumps and first and second chambers, said first chamber spanning said first sump and a portion of said second sump and said second chamber spanning the remainder of said second sump, each of said chambers having a port therein;

a single noncorrosive fluid having a boiling point at atmospheric pressure sufficiently in excess of the liquidus temperature of the solder to be reflowed, said fluid in its liquid state occupying said first and second sumps and in its vapor state occupying a portion of said first chamber;

means for boiling said liquid in said first sump to generate said vapor occupying said portion of said first chamber;

means for maintaining said liquid in said second sump at a temperature such that said solder temperature is below its eutectic point;

means for controlling said vapor at a predetermined level above said first sump;

means for moving said web through said vapor occupying said portion of said first chamber, said vapor melting said solder causing it to reflow, said web being moved along a plane oriented at a predetermined angle with respect to a horizontal plane such that said solder is maintained at a generally uniform thickness while molten; and means for cooling said solder after exiting from said vapor.

2. The machine in accordance with claim 1 wherein said first sump vapor controlling means comprises
first and second condenser elements positioned along enclosing surfaces of said chamber containing said vapor.

3. The machine in accordance with claim 1 wherein said boiling means comprises:
a plurality of heating elements; and
means for controlling the temperature of said heating elements to maintain said fluid in contact therewith at a nearly uniform temperature.

4. The machine in accordance with claim 3 wherein said plurality of heating elements have a uniform resistance per unit of length which allows a proportionate reduction in power to produce a proportionate reduction in heat flux thereby reducing the production of hot spots in said fluid and improving the usable lifetime of said fluid.

5. The machine in accordance with claim 1 wherein said moving means comprises:
a first roller, at least a portion of which is immersed in said fluid in said second sump, for guiding said flexible circuit webs therearound;
at least one other roller external to an exit port having said flexible circuit webs in contact therewith;
means for driving said other roller; and
means for controlling said driving means so that the tension in said webs is just sufficient to maintain them in a planar orientation during passage through said vapor.

6. The machine in accordance with claim 5 wherein said driving tension controlling means comprises:
a tension maintaining roller having said flexible circuit webs in contact therewith;
a pneumatic constant load device;
means, pivotally mounted on said enclosure and having one end coupled to said tension maintaining roller and an opposite end coupled to said pneumatic load device, for maintaining a force on said tension roller in proportion to the tension exerted on said webs; and means, coupled to said maintaining means, for providing an electrical signal to said driving means to adjust its rotational speed.

7. The machine in accordance with claim 1 further comprising:
means, threadably traversing said enclosure, for facilitating threading of said flexible circuit webs therethrough; and
means for driving said facilitating means.

8. The machine in accordance with claim 7 wherein said facilitating means comprises:
first and second pluralities of pulleys;
first and second continuous, spaced-apart, flexible transport members coupled around said pulleys; and
a rigid member connected between said first and second transport members.

9. The machine in accordance with claim 8 wherein said driving means comprises:
a motor;
a shaft affixed to first and second opposed pulleys in said first and second pluralities of pulleys, respectively;
a drive pulley affixed to said shaft at an intermediate point along its length; and
means for coupling said motor to said drive pulley so that rotation of said motor causes said transport members to be threaded through said enclosure from an entry port to an exit port.

10. The machine in accordance with claim 1 further comprising:
a support frame;
means for pivotally mounting a bottom edge of said enclosure to said support frame;
means for adjusting the elevation of an opposite bottom edge of said enclosure with respect to said support frame; and
means for locking said adjusting means for the selected elevation.

11. The machine in accordance with claim 1 further comprising:
means for decreasing the flow of convection air currents through said vapor; and
means for removing droplets of vapor which might pass from said fluid to said vapor.

12. The machine in accordance with claim 11 wherein said decreasing means comprises:
a first baffle positioned slightly below an interface separating said vapor from air; and
a second baffle positioned just below said flexible circuit webs and extending between said first sump and said vapor level controlling means.

13. The machine in accordance with claim 1 wherein said cooling means comprises a doghouse-shaped condenser element having oppositely directed members positioned above said flexible circuit webs said oppositely directed members oriented at common angles with respect to a plane containing said flexible circuit webs so that condensate collected thereon is prevented from dropping onto said flexible circuit webs.

14. The machine in accordance with claim 1 further comprising:
means for recapturing residual traces of condensate on said flexible circuit webs; and
means for inhibiting escape of said vapor from said machine.

15. The machine in accordance with claim 14 wherein said recapturing means comprises:

a plurality of rollers for reheating said solder to a temperature below its eutectic temperature;

a plurality of diffusion traps, one diffusion trap following each of said rollers, said diffusion traps condensing vapors driven off said flexible circuit webs by said reheat rollers;

means for preventing condensed vapors from coming into contact with said flexible circuit webs; and means for separating associated reheat rollers and diffusion traps from one another.

16. The machine in accordance with claim 14 wherein said inhibiting means comprises:

first and second overlapping, opposed flexible membranes; and means for fastening said membranes along edges of an entry port and an exit port.

17. The machine in accordance with claim 1 wherein said vapor level controlling means comprises:

means for cooling air above said vapor; and means for adjusting the location of said cooling means.

18. The machine in accordance with claim 17 wherein said air cooling means comprises:

first and second condenser elements; and means for slidably mounting said condenser elements.

* * * * *